(12) United States Patent
Nakada et al.

(10) Patent No.: US 9,177,964 B2
(45) Date of Patent: Nov. 3, 2015

(54) METHODS OF FORMING SIDEWALL GATES

(71) Applicant: SanDisk 3D LLC, Milpitas, CA (US)

(72) Inventors: Akira Nakada, Yokkaichi Mie (JP);
Michiaki Sano, Aichi ken (JP); Naohito Yanagida, Yokkaichi Mie (JP); Teruyuki Mine, Yokkaichi Mie (JP)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/099,084

(22) Filed: Dec. 6, 2013

(65) Prior Publication Data
US 2015/0162338 A1    Jun. 11, 2015

(51) Int. Cl.
| H01L 27/115 | (2006.01) |
| H01L 29/78 | (2006.01) |
| H01L 29/423 | (2006.01) |
| H01L 29/66 | (2006.01) |
| H01L 27/24 | (2006.01) |

(52) U.S. Cl.
CPC ............ *H01L 27/115* (2013.01); *H01L 27/249* (2013.01); *H01L 27/2454* (2013.01); *H01L 29/42376* (2013.01); *H01L 29/66666* (2013.01); *H01L 29/7827* (2013.01)

(58) Field of Classification Search
USPC .......................... 438/268, 257, 283, 248, 386
See application file for complete search history.

(56) References Cited

U.S. PATENT DOCUMENTS

| 2009/0001344 | A1 | 1/2009 | Schricker et al. | |
| 2010/0140688 | A1 | 6/2010 | Fujimoto | |
| 2011/0006360 | A1 | 1/2011 | Ikebuchi | |
| 2011/0303966 | A1* | 12/2011 | Masuoka et al. | 257/321 |
| 2013/0307037 | A1* | 11/2013 | Masuoka et al. | 257/288 |
| 2013/0320433 | A1 | 12/2013 | Cho et al. | |

OTHER PUBLICATIONS

Notification of Transmittal of the International Search Report and the Written Opinion of the International Searching Authority, or the Declaration for Int'l Application No. PCT/US2014/068647 mailed Feb. 27, 2015, 9 pages.

* cited by examiner

*Primary Examiner* — Mamadou Diallo
(74) *Attorney, Agent, or Firm* — Davis Wright Tremaine LLP

(57) ABSTRACT

A method of forming sidewall gates for vertical transistors includes depositing a gate dielectric layer over polysilicon channel structures, and depositing a gate polysilicon layer over the gate dielectric. The gate polysilicon layer is then etched back to form separated gate electrodes. Filler portions are then formed between gate electrodes, which are then etched from the top down while their sides are protected.

19 Claims, 11 Drawing Sheets

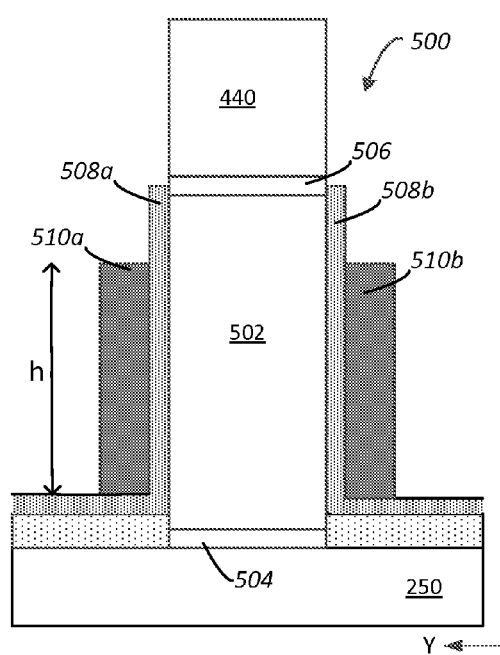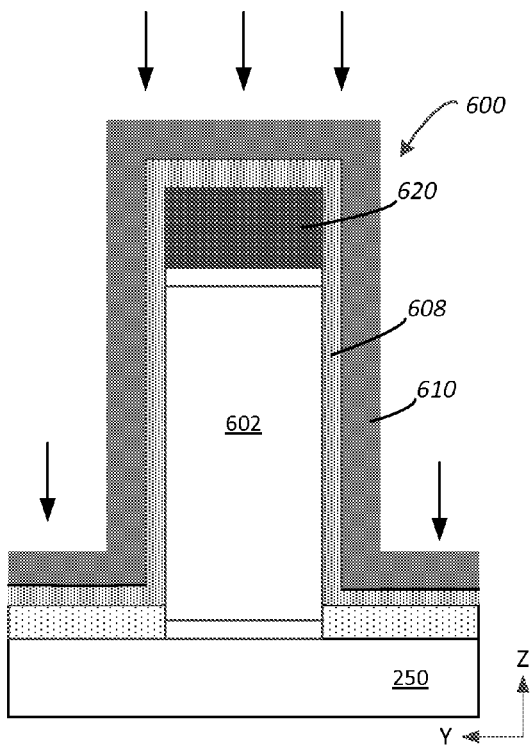
FIG. 5  FIG. 6
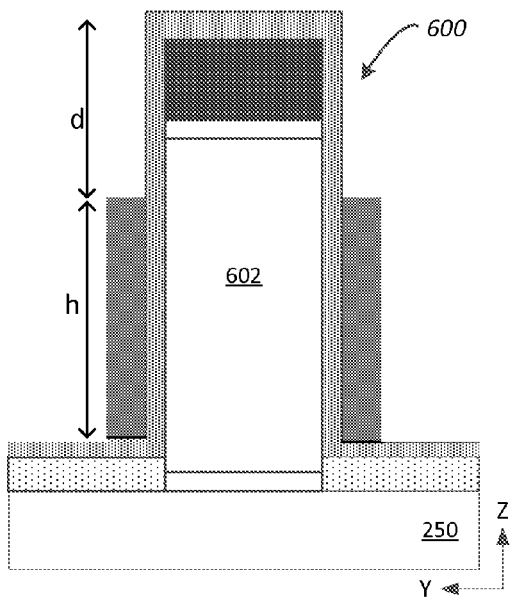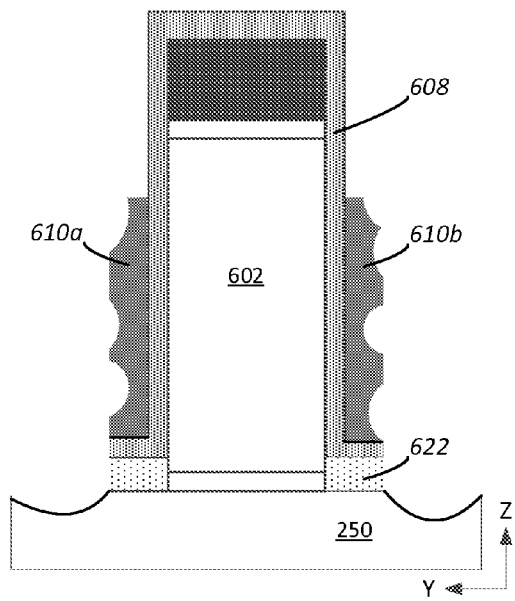
FIG. 7  FIG. 8

METHODS OF FORMING SIDEWALL GATES

BACKGROUND

The subject matter of this application is the structure, use, and making of re-programmable non-volatile memory cell arrays, and, more specifically, to methods of making select transistors used in three-dimensional arrays of memory storage elements.

Re-programmable non-volatile mass data storage systems are widespread for storing data of computer files, camera pictures, and data generated by and/or used by other types of hosts. A popular form of flash memory is a card that is removably connected to the host through a connector. There are many different flash memory cards that are commercially available, examples being those sold under trademarks CompactFlash (CF), the MultiMediaCard (MMC), Secure Digital (SD), miniSD, microSD, Memory Stick, Memory Stick Micro, xD-Picture Card, SmartMedia and TransFlash. These cards have unique mechanical plugs and/or electrical interfaces according to their specifications, and plug into mating receptacles provided as part of or connected with the host.

Another form of nonvolatile memory systems in widespread use is the flash drive, which is a hand held memory system in a small elongated package that has a Universal Serial Bus (USB) plug for connecting with a host by plugging it into the host's USB receptacle.

In yet another form of nonvolatile memory system, a large amount of memory is permanently installed within host systems, such as within a notebook computer in place of the usual disk drive mass data storage system. Memory systems may contain their own memory controller and drivers but there are also some memory only systems that are instead controlled at least in part by software executed by the host to which the memory is connected. The memory is typically formed on one or more integrated circuit chips and the controller on another circuit chip. But in some memory systems that include the controller, especially those embedded within a host, the memory, controller and drivers are often formed on a single integrated circuit chip.

A type of re-programmable non-volatile memory cell uses variable resistance memory elements that may be set to either conductive or non-conductive states (or, alternately, low or high resistance states, respectively), and some additionally to partially conductive states and remain in that state until subsequently re-set to the initial condition. The variable resistance elements are individually connected between two orthogonally extending conductors (typically a bit line and a word line) where they cross each other in a two-dimensional array. The state of such an element is typically changed by proper voltages being placed on the intersecting conductors. These voltages are necessarily also applied to a large number of other unselected resistive elements because they are connected along the same conductors as the selected elements being programmed or read, diodes are commonly connected in series with the variable resistive elements in order to reduce leakage currents that can flow through them.

The desire to perform data reading and programming operations with a large number of memory cells in parallel results in reading or programming voltages being applied to a very large number of other memory cells along long conductors. This may require conductors (e.g. bit lines) to be supplied with significant current so that they can rapidly charge up to an appropriate voltage. Select transistors may be placed to supply current to selected conductors and to isolate unselected conductors. An example of an array of variable resistive memory elements and associated diodes is given in patent application publication no. US 2009/0001344 A1.

SUMMARY OF THE INVENTION

A method of forming sidewall gates for vertical transistors includes depositing a gate dielectric layer over polysilicon channel structures, and depositing a gate polysilicon layer over the gate dielectric. The gate polysilicon layer is then etched back to form separate gate electrodes. Filler portions (e.g. of Silicon Dioxide, resist, or other suitable material) are then formed between gate electrodes so that they cover sides of gate electrodes and cover areas between gate electrodes. Gate electrodes are then etched from the top down while their sides are protected. In this way, gate electrode height can be reduced in a controlled manner without damaging sides of gate electrodes and without damaging areas between gate electrodes.

An example of a method of forming a three dimensional memory array includes: forming a plurality of vertical polysilicon structures; subsequently depositing a dielectric layer on sidewalls of the plurality of vertical polysilicon structures; subsequently depositing a polysilicon gate layer on the dielectric layer on sidewalls of the plurality of vertical polysilicon structures; subsequently etching back the polysilicon gate layer to form separate polysilicon gate electrodes; subsequently forming filler portions between the polysilicon gate electrodes, the filler portions covering sides of the polysilicon gate electrodes and exposing tops of the polysilicon gate electrodes; and subsequently etching the polysilicon gate electrodes from the exposed tops downwards while the filler portions cover sides of the polysilicon gate electrodes.

The plurality of vertical polysilicon structures may form channels of vertical transistors controlled by the polysilicon gate electrodes. The plurality of vertical polysilicon structures may be formed on a plurality of global bit lines that extend horizontally along a first direction. The polysilicon gate electrodes may extend horizontally in a second direction that is perpendicular to the first direction. A barrier layer may be formed between the plurality of global bit lines and the vertical polysilicon structures. Forming filler portions may include etching back a filler material to expose tops of the polysilicon gate electrodes. The filler portions may be formed of Silicon Dioxide. The filler portions may be formed of a resist material. The polysilicon gate electrodes may be etched from the exposed tops downwards using a wet etch. The wet etch may be selective to the polysilicon gate electrodes over the filler portions. The method may include subsequently forming vertical bit lines extending up from the vertical polysilicon structures and controlling current in the vertical bit lines by biasing the polysilicon gate electrodes.

An example of a method of forming a vertical transistor includes: forming a vertical polysilicon structure; subsequently depositing a dielectric layer on sidewalls of the vertical polysilicon structure; subsequently depositing a polysilicon gate layer on the dielectric layer on sidewalls of the vertical polysilicon structure; subsequently etching back the polysilicon gate layer to form separate polysilicon gate electrodes; subsequently forming filler portions covering sides of the polysilicon gate electrodes and exposing tops of the polysilicon gate electrodes; and subsequently etching the polysilicon gate electrodes from the exposed tops downwards while the filler portions cover sides of the polysilicon gate electrodes.

The vertical polysilicon structure may form a channel of a vertical transistor that is controlled by the polysilicon gate electrodes on either side. The vertical polysilicon structure may be formed on a global bit line that extends horizontally along a first direction. The polysilicon gate electrodes may extend horizontally in a second direction that is perpendicular to the first direction. A barrier layer may be formed between the global bit line and the vertical polysilicon structure. Forming filler portions may include etching back a filler material to expose tops of the polysilicon gate electrodes. The filler portions may be formed of Silicon Dioxide. The filler portions may be formed of a resist material. The polysilicon gate electrodes may be etched from the exposed tops downwards using a wet etch.

Various aspects, advantages, features and details of the innovative three-dimensional variable resistive element memory system are included in a description of exemplary examples thereof that follows, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 5 shows an example of a vertical transistor used as a pillar select device.

FIG. 6 illustrates an example of a pillar select transistor at an intermediate stage of fabrication, showing how a gate polysilicon layer may be formed into separate polysilicon gate electrodes.

FIG. 7 illustrates an idealized result of the formation step of FIG. 6.

FIG. 8 illustrates certain problems associated with the formation step of FIG. 6.

DESCRIPTION OF EXEMPLARY EMBODIMENTS

Figure 1:
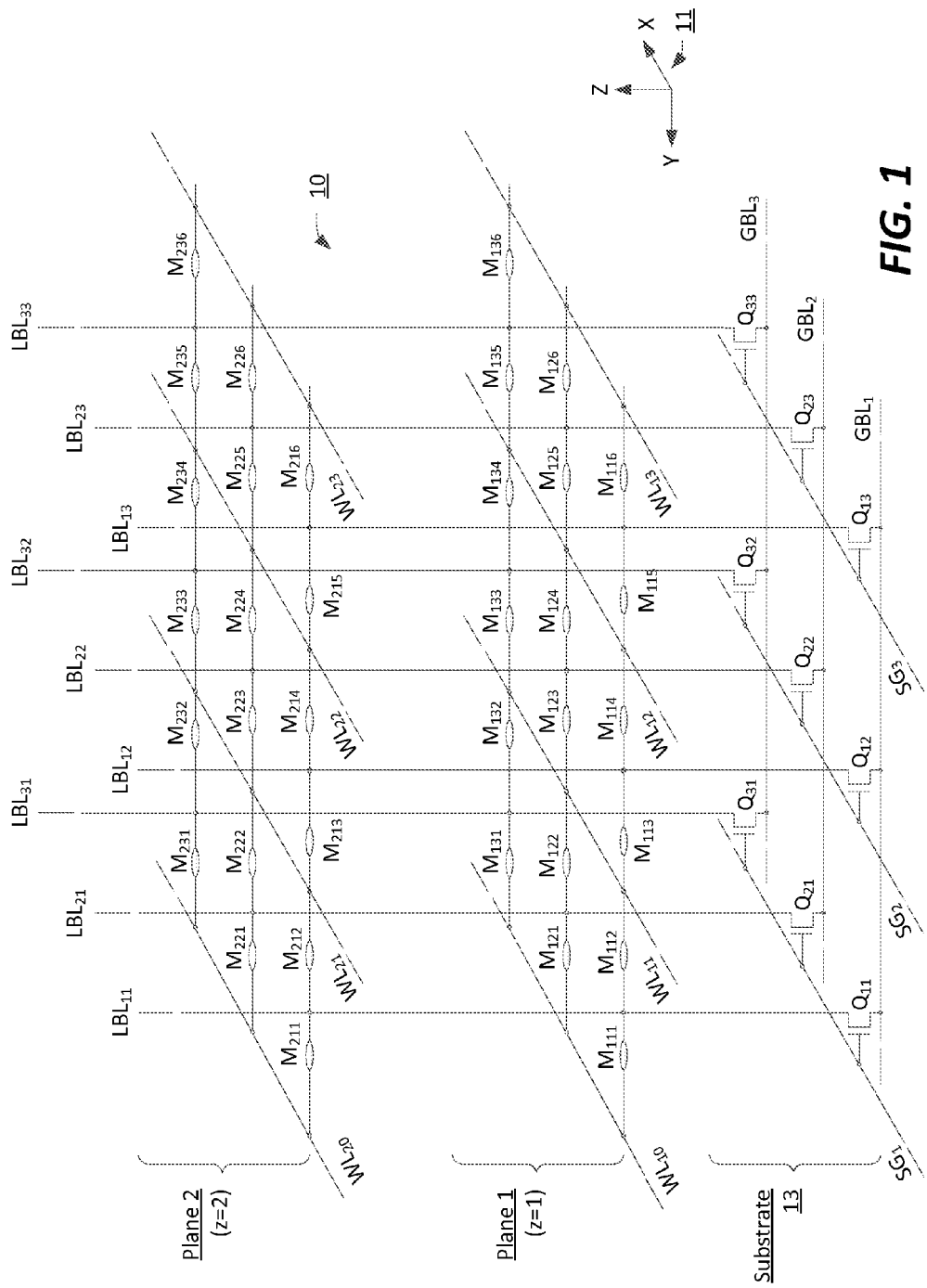
FIG. 1 is a schematic of a portion of a three-dimensional array of variable resistance memory elements, wherein the array has vertical bit lines.

Referring initially to FIG. 1, a three-dimensional memory 10 is schematically and generally illustrated in the form of an equivalent circuit of a portion of such a memory. This is a specific example of the three-dimensional array summarized above. A standard three-dimensional rectangular coordinate system 11 is used for reference, the directions of each of vectors x, y and z being orthogonal with the other two.

A circuit for selectively connecting internal memory elements with external data circuits may be formed in a semiconductor substrate 13. In this specific example, a two-dimensional array of select or switching devices $Q_{xy}$ are utilized, where x gives a relative position of the device in the x-direction and y its relative position in the y-direction. The individual devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices Q having the same position in the x-direction, although during reading and also typically programming only one select device connected with a specific global bit line is turned on at time. The other of the source or drain of the individual select devices Q is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, control gate lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the control gate lines $SG_y$ receives a voltage that turns on the select devices to which it is connected. The remaining control gate lines receive voltages that keep their connected select devices off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory storage elements $M_{zxy}$ are formed in a plurality of planes positioned at different distances in the z-direction above the substrate 13. Two planes 1 and 2 are illustrated in FIG. 1 but there will typically be more, such as 4, 6 or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{xy}$ being connected with storage elements $M_{zxy}$ of each plane through which the local bit lines extend.

Figure 2:
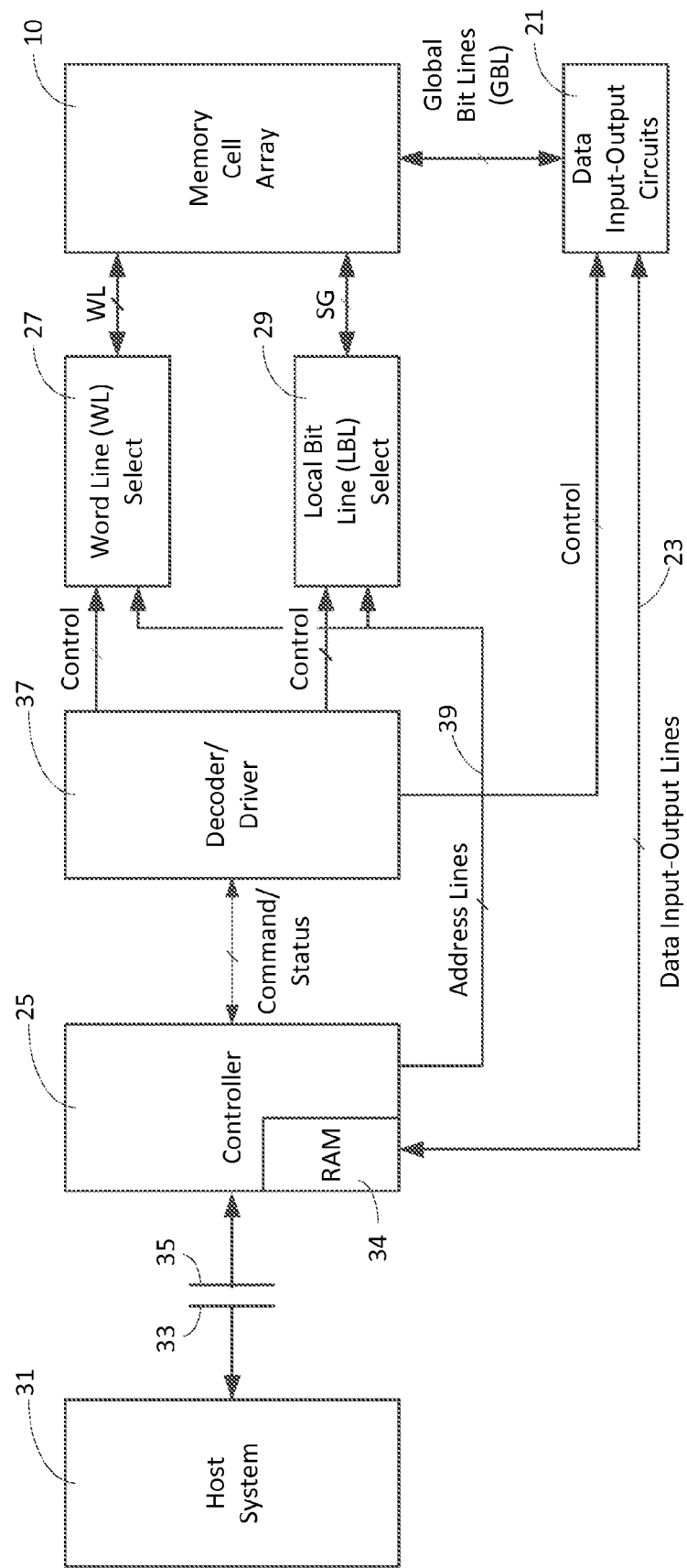
FIG. 2 is a schematic block diagram of a re-programmable non-volatile memory system which utilizes the memory cell array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed storage elements $M_{zxy}$. The circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and select gate control lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

The memory system controller 25 typically receives data from and sends data to a host system 31. The controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

The memory system controller 25 conveys to decoder/driver circuits 37 commands received from the host. Similarly, status signals generated by the memory system are communicated to the controller 25 from the circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory element array 10 of FIG. 1, the system is not limited to use of only that array architecture. A given memory system may alternatively combine this type of memory with other another type including flash memory, such as flash having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is generally preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory cell arrays. Resetting a block of memory elements to a common state corresponds to erasing a block of flash memory cells to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
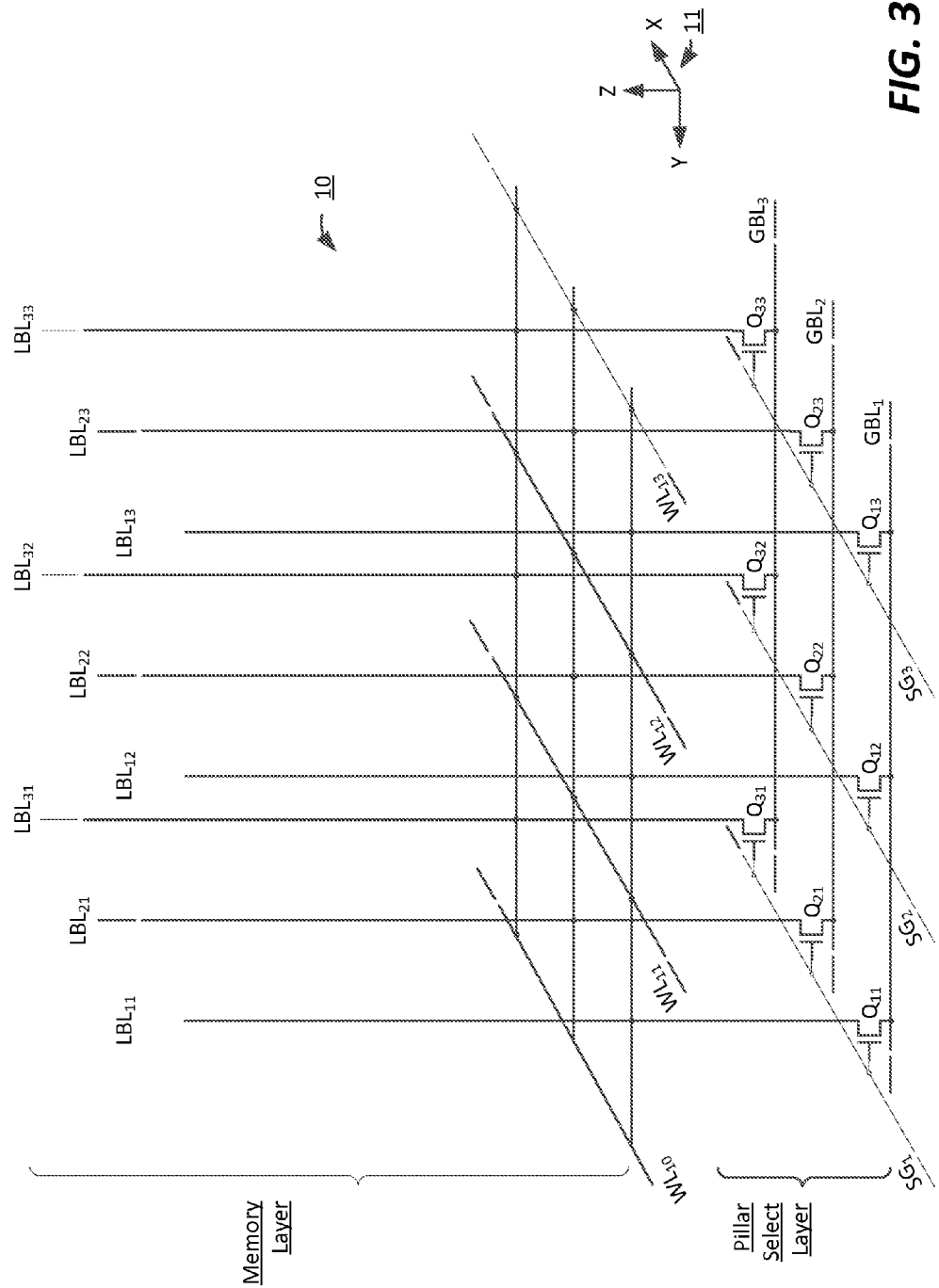
FIG. 3 illustrates a memory layer and pillar select layer in a three dimensional memory system.

FIG. 3 illustrates schematically the 3D memory comprising of a memory layer on top of a pillar select layer. The 3D memory 10 is formed on top of a CMOS substrate (not shown explicitly) where structures in the CMOS are referred to as being in the FEOL ("Front End of Lines") layer. Thus, the BEOL comprises of the pillar select layer with the memory layer on top of it. The select devices such as $Q_{11}, Q_{12}, \ldots, Q_{21}, Q_{22}, \ldots$ etc. are formed in the pillar select layer. The memory layer is similar to that illustrated in FIG. 1, comprising of multiple layers of word lines and R/W elements.

Figure 4B:
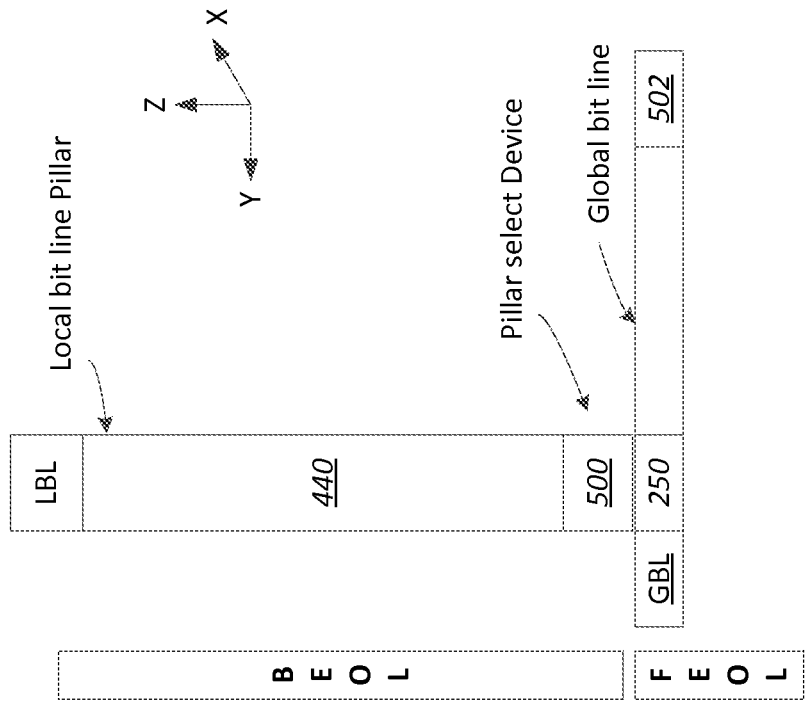
FIGS. 4A-4B show a pillar select device schematically.
Figure 4A:
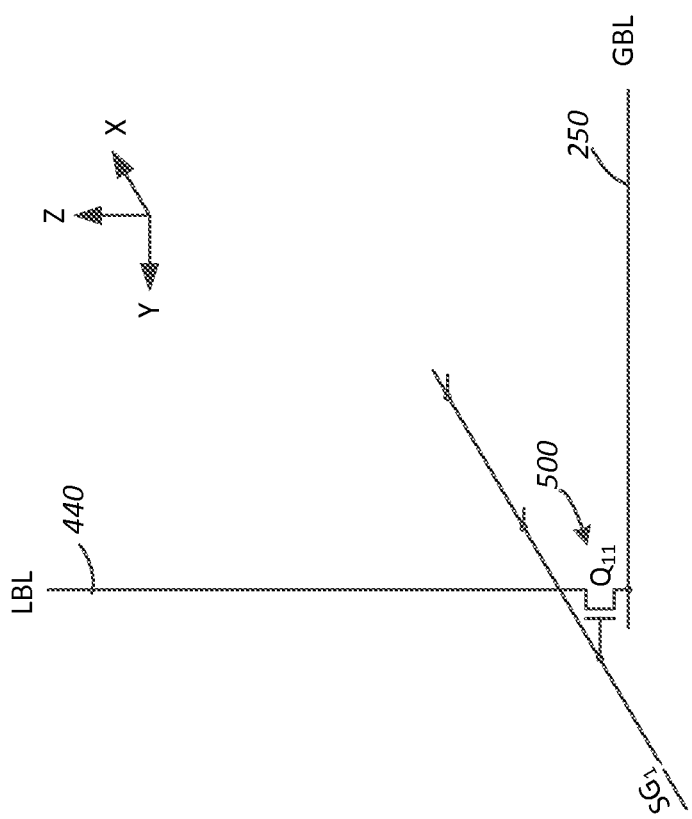

FIG. 4A illustrates a schematic circuit diagram of a given pillar select device switching a local bit line to a global bit line. In the example, the local bit line LBL 440 is switchable to the global bit line GBL 250 by a select transistor 500 such as $Q_{11}$. The gate of the select transistor $Q_{11}$ is controllable by a signal exerted on a block select line $SG_1$.

FIG. 4B illustrates the structure of the pillar select device in relation to the local bit line and the global bit line. The global bit line such as GBL 250 is formed in the FEOL as part of the metal layer-1 or metal layer-2 502. The pillar select device in the form of the select transistor 500 is formed in the BEOL layer on top of the GBL 250. The local bit line LBL 440, in the form of a pillar, is formed on top of the pillar select device 500. In this way, the pillar select device 500 can switch the local bit line pillar LBL to the global bit line GBL.

A pillar select device, such as pillar select device 500, may be formed in various ways. In some examples a vertical transistor is used as a pillar select device. The gate of such a transistor may be formed by a select line (or may be electrically connected to a select line) while the channel extends between a GBL and an LBL. Thus, the transistor can be turned on to connect the GBL and LBL, and may be turned off to isolate the LBL from the GBL.

FIG. 5 shows an example of a vertical transistor that is used as pillar select device 500. FIG. 5 is a cross section of transistor 500, which shows GBL 250 extending in the y-direction and a polysilicon channel structure 502 extending upwards between GBL 250 and a LBL 440. Layers of barrier material 504, 506 (for example, a combination of Titanium and Titanium Nitride layers "Ti/TiN") are formed at either end of the polysilicon channel structure 502 to protect the polysilicon. Gate dielectric portions 508a, 508b extend along sides of the polysilicon channel structure 502. The gate dielectric portions may be formed of any suitable dielectric material including Silicon Dioxide (SiO2, sometimes referred to simply as "oxide"). On either side of the polysilicon channel structure 502, separated from the polysilicon channel structure by the gate dielectric portions 508a, 508b, lie gate electrodes 510a, 510b. While two gate electrodes are present, they may be operated together so that they act as a single gate electrode. In some cases they may be electrically connected together.

One important dimension of vertical transistor 500 is the height (vertical dimension), h, of the polysilicon gate electrodes 510a, 510b. If this height is not sufficient, then gate electrodes may have relatively high resistance and provide insufficient voltage to turn on all select transistors. If this height is excessive, then the gate electrodes may not be sufficiently isolated from the conductive vertical bit line 440. Producing select transistors with correct and uniform gate electrode dimensions is important. However, this presents some difficulties.

FIG. 6 illustrates a method of forming polysilicon gate electrodes from a polysilicon layer. FIG. 6 illustrates a select transistor at an intermediate stage of fabrication 600, prior to formation of vertical bit lines. A hard mask portion 620 (e.g Silicon Nitride, or "SiN") overlies the polysilicon channel structure 602 and a gate dielectric layer 608 extends over the hard mask portion and along sides of the polysilicon channel structure 602. A conductive (highly doped, e.g. N+) polysilicon layer 610 extends over the gate dielectric layer 608. Anisotropic etching (e.g. Reactive Ion Etching, "RIE") is applied in FIG. 6 (as indicated by arrows indicating direction of ion bombardment) so that the polysilicon layer is etched downwards. Polysilicon is removed from horizontal surfaces (where it overlies the polysilicon channel structure 602 and GBL 250) to leave portions along sides of the polysilicon channel structure 602.

FIG. 7 shows how the structure 600 of FIG. 6 would ideally look after anisotropic etching of the polysilicon gate layer. Polysilicon has been completely removed from horizontal surfaces and has been further removed down to a depth d along sides of polysilicon channel structure 602. It can be seen that the depth of this etch, d, determines the height of the polysilicon gate electrodes, h. In many cases, the value of d is significant and the etching required to achieve such a depth has undesirable consequences. For example, the depth d may be 80 nm for a polysilicon gate layer thickness of 17 nm, more than four times the layer thickness.

FIG. 8 illustrates how such an etch may affect the device. FIG. 8 shows some damage to the GBL 250 where the etch has penetrated through the gate dielectric 668 and the protective dielectric 622 on the GBL. This may damage GBL 250, and may cause Tungsten from GBL 250 to contaminate other areas. For example, Tungsten from GBL 250 may contaminate gate electrodes and impact device performance. FIG. 8 also shows damage along the sides of gate electrodes 610a, 610b, from prolonged exposure to etching. Even though anisotropic etching (directed vertically) is used, some damage occurs along such vertical surfaces. The average thickness (lateral dimension along y-direction) of gate electrodes 610a, 610b, may be diminished by such an etch, resulting in higher overall resistance along gate electrodes. Damage may be localized resulting in areas of high resistance which may cause voltage to step down at certain locations.

Figure 9:
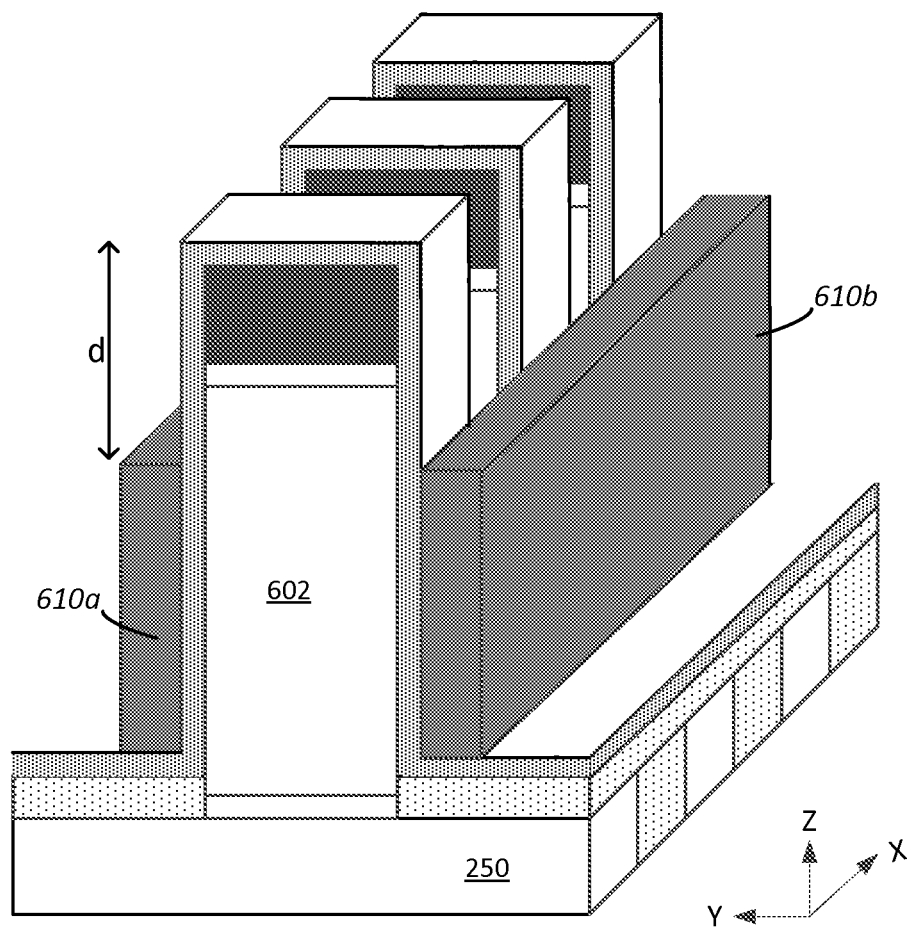
FIG. 9 shows a three dimensional view of pillar select transistors at an intermediate stage of fabrication.

FIG. 9 shows a three dimensional view of pillar select transistor structures at an intermediate stage of fabrication (corresponding to FIG. 7). It can be seen that gate electrodes 610a, 610b extend in the x-direction so that the same voltages are applied to a row of select transistors. Thus, gate electrodes 610a, 610b, operated together form a select line to select a row of LBLs for connection to GBLs. In order to provide adequate voltage to control all pillar select transistors along the x-direction, the resistance of gate electrodes 610a, 610b, should be reasonably low and reasonably uniform. Etch damage makes this difficult to achieve. In order to correctly bias all pillars along a GBL and provide sufficient current to charge up vertical bit lines, a GBL (such as GBL 250) should have reasonably low and uniform resistance. However, etch damage may increase resistance at certain locations making this difficult to achieve.

According to an aspect of the present invention, a method of making a vertical transistor provides filler portions between gate electrodes to protect sides of gate electrodes and to protect underlying dielectric and GBL. Tops of gate electrodes are exposed to allow etching of gate electrodes from the top down, without exposing sides of gate electrodes, and without exposing areas between gate electrodes.

Figure 10:
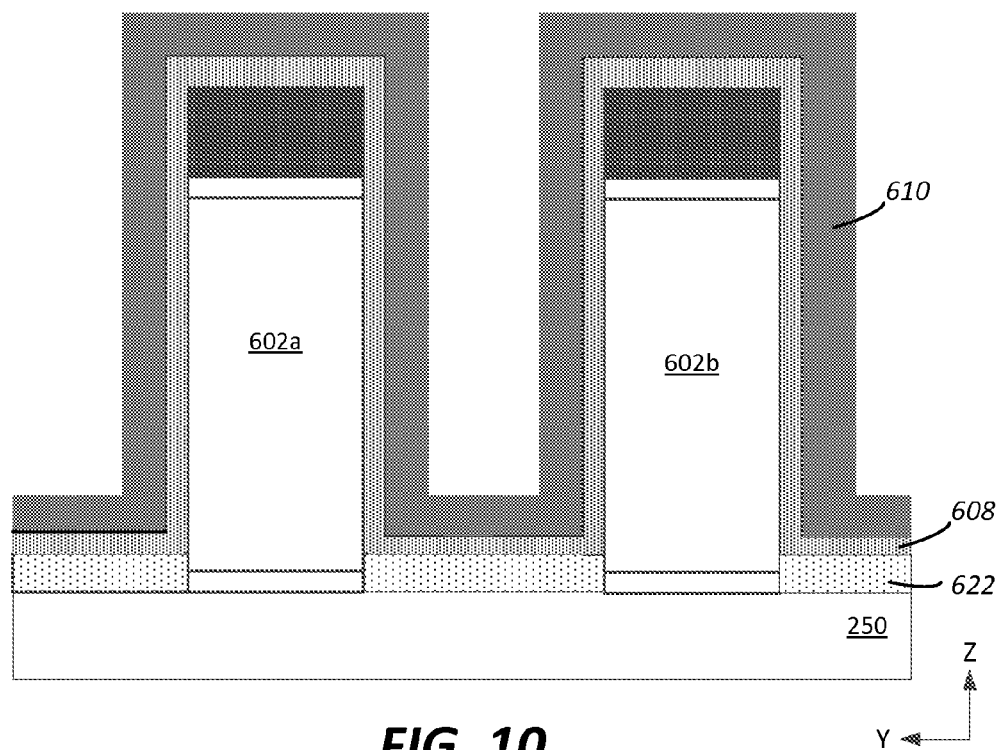
FIG. 10 shows a cross section of pillar select transistors at an intermediate stage of fabrication according to an example.

FIG. 10 shows a cross section along the y-z plane at an intermediate stage of fabrication after deposition of a gate electrode layer 610 (e.g. N+ polysilicon, 17 nm thick) over a gate dielectric layer 608, which overlies polysilicon channel structures 602a, 602b.

Figure 11:
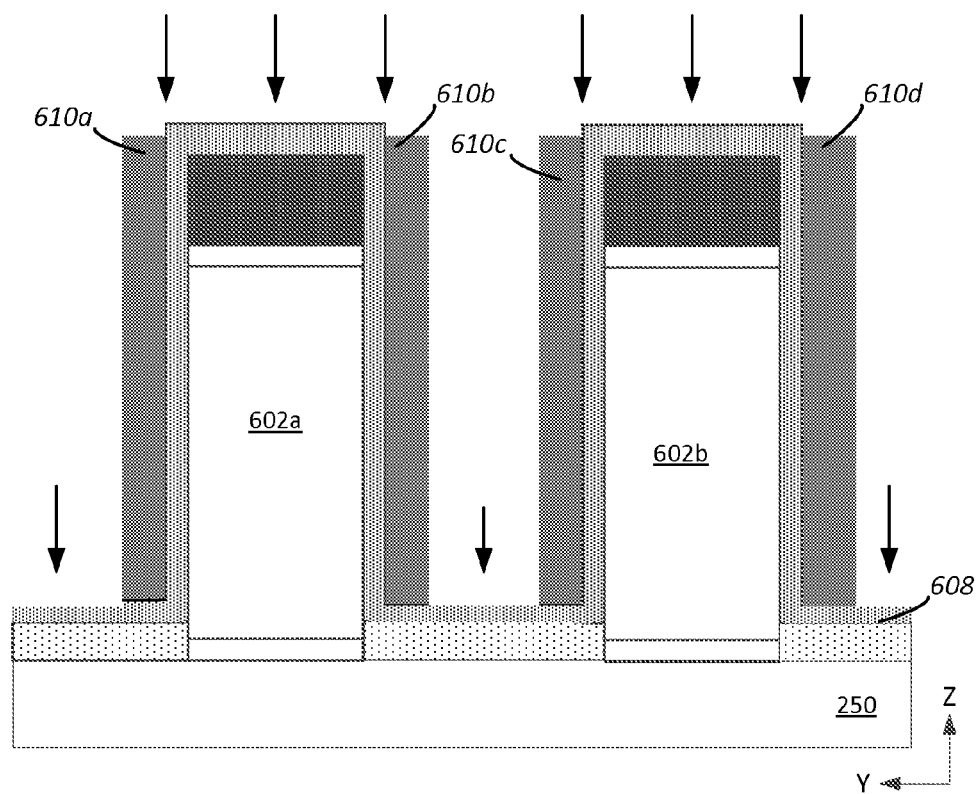
FIG. 11 illustrates etching to form separate gate electrodes.

FIG. 11 illustrates etching of the gate electrode layer of FIG. 10 to a depth that is little more than the thickness of the gate electrode layer 610 (e.g. 20 nm). Thus, separate gate electrodes 610a-d are formed from the gate electrode layer 610. Over-etching ensures that all gate electrode material is removed from over polysilicon channel structures 602a, 602b, and from between gate electrodes. However, by over-etching by just a small amount, damage to the sides of gate electrodes and to the dielectric between gate electrodes is kept to a very low level. (In contrast, the damage shown in FIG. 8 was from over-etching significantly—an etch depth of 80 nm for a 17 nm layer.)

Figure 12:
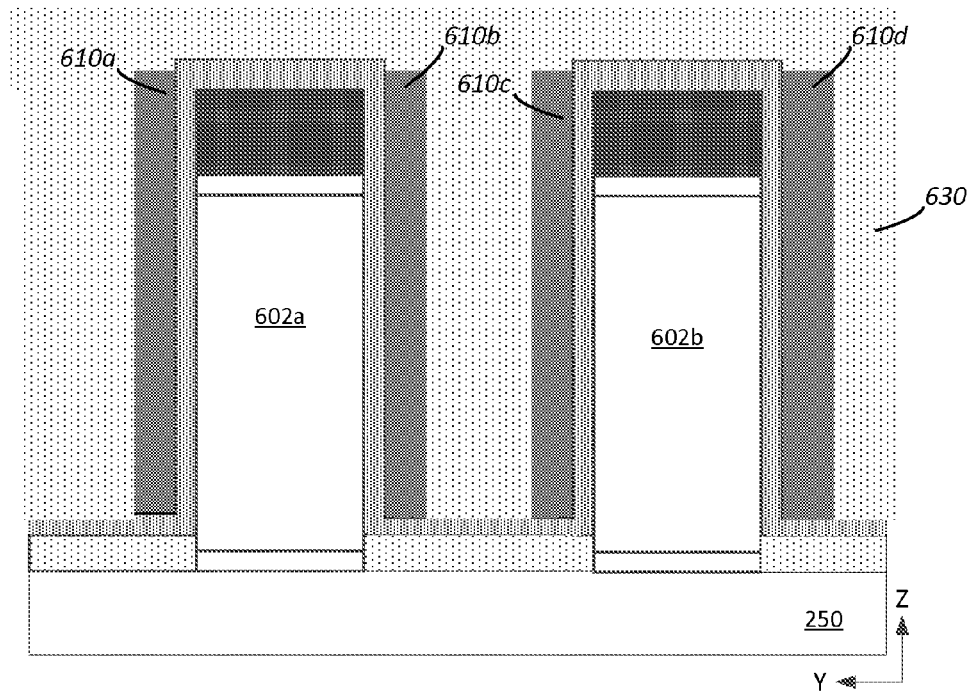
FIG. 12 illustrates deposition of filler material between gate electrodes.

FIG. 12 illustrates a deposition step that is subsequent to the etch of FIG. 11. In particular, FIG. 12 shows filler material 630 deposited between gate electrodes 610a-d and overlying the gate electrodes and polysilicon channel structures. Filler material 630 may be any suitable material. For example, Silicon Dioxide deposited by Chemical Vapor Deposition (CVD) may be used. Alternatively, a filler material such as a Carbon-based resist may be spun-on or otherwise deposited so that it fills between gate electrodes.

Figure 13:
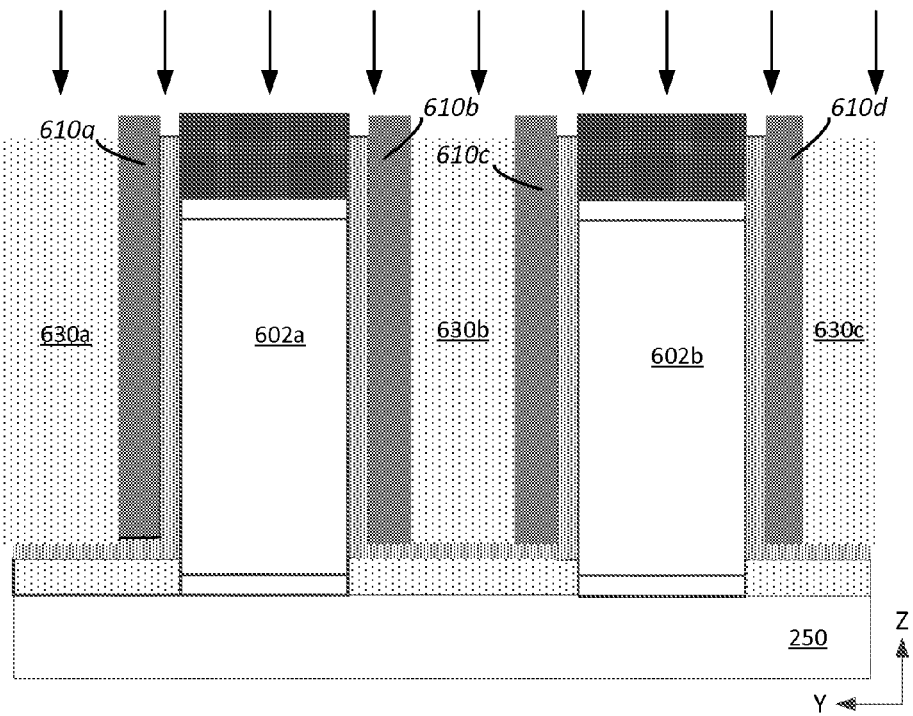
FIG. 13 illustrates etching back of filler material to form separate filler portions and to expose tops of polysilicon gate electrodes.

FIG. 13 shows etching back filler material 630 to remove filler material overlying gate electrodes 610a-d and thereby expose the tops of gate electrodes 610a-d. A wet etch may be used for this purpose. A suitable etch chemistry is one that is selective to the filler material over gate electrodes (i.e. selective to oxide over polysilicon). Portions of filler 630a-c material remain between gate electrodes 610a-d at this time and cover sides of the gate electrodes and cover areas between gate electrodes.

Figure 14:
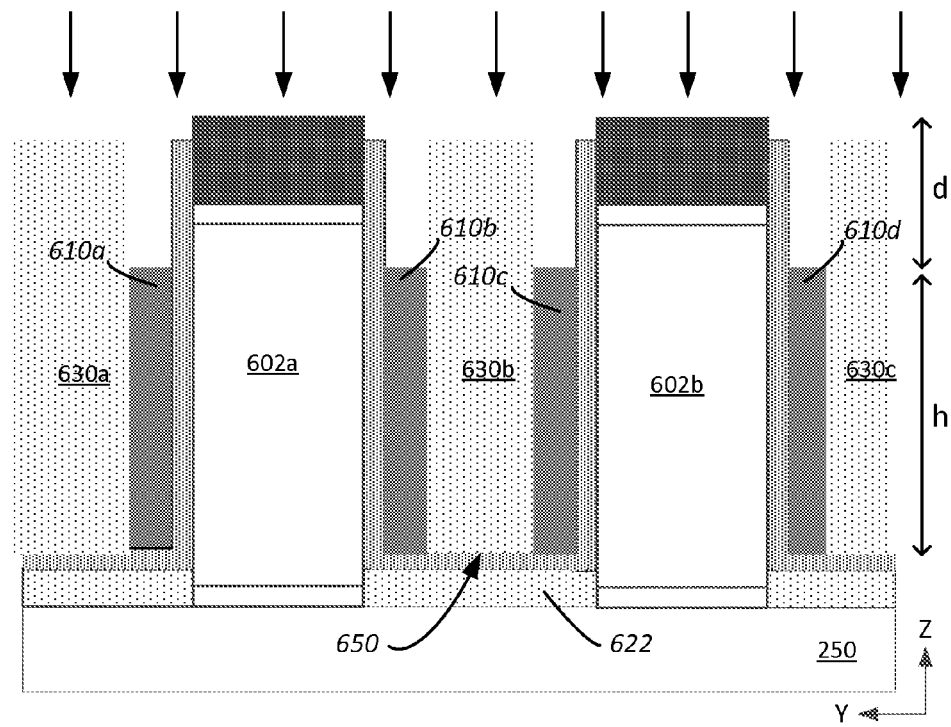
FIG. 14 illustrates etching polysilicon gate electrodes from the top down.

FIG. 14 shows subsequent etching of gate electrodes 610a-d from the top down. A suitable etch may be used that is selective to gate electrode material over filler and gate dielectric (for example, selective to polysilicon over oxide—e.g. hot TMY). The depth, d, of the etch determines the height, h, of the gate electrodes as before. The depth here may be significant (e.g. of the order of 80 nm). However, unlike the example of FIG. 8, the sides of gate electrodes 610a-d are covered by filler portions 630a-c during this etch so that gate electrodes are only etched from the top down and are not etched from the sides. Furthermore, filler portions 630a-c overlie areas between gate electrodes providing protection to dielectric and GBLs in these areas (e.g. protective dielectric 622 and GBL 250 in area 650 between gate electrodes 610b and 610c).

Figure 15:
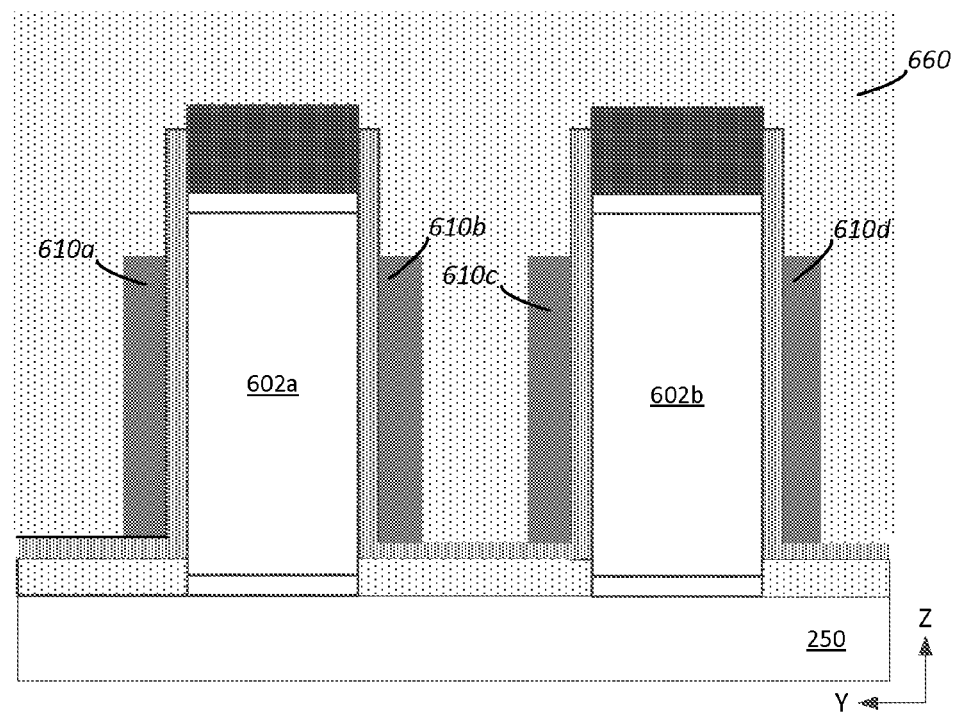
FIG. 15 illustrates deposition of an insulating material.

FIG. 15 shows the structure of FIG. 14 after deposition of an insulating material 660 to provide insulation over gate electrodes 610a-d. The insulating material may be Silicon Dioxide or other material which may be simply deposited over existing Silicon Dioxide filler portions to form a continuous insulating layer over, and between gate electrodes.

Figure 16:
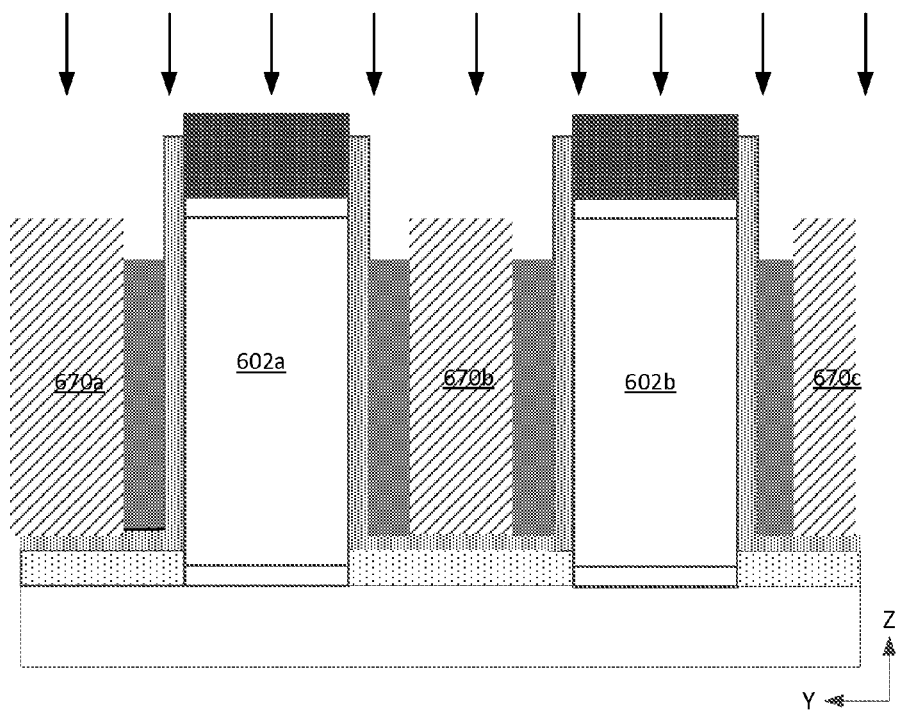
FIG. 16 illustrates an embodiment in which polysilicon gate electrodes and filler portions are etched together.

While Silicon Dioxide is one suitable filler material, other filler materials may also be used. For example, a Carbon-based resist may be used. FIG. 16 shows an example where filler portions 670a-c are formed of such resist (by depositing and etching back). FIG. 16 shows an etch step to establish the height of gate electrodes. In contrast to the example of FIG. 14, filler portions 670a-c are etched along with the gate electrodes in this example. Thus, it is not necessary to have an etch that is selective to gate electrode material for this step. If both gate electrodes and filler portions etch at the same rate then the filler portion will continue to cover sides of the gate electrodes throughout the etch.

Figure 17:
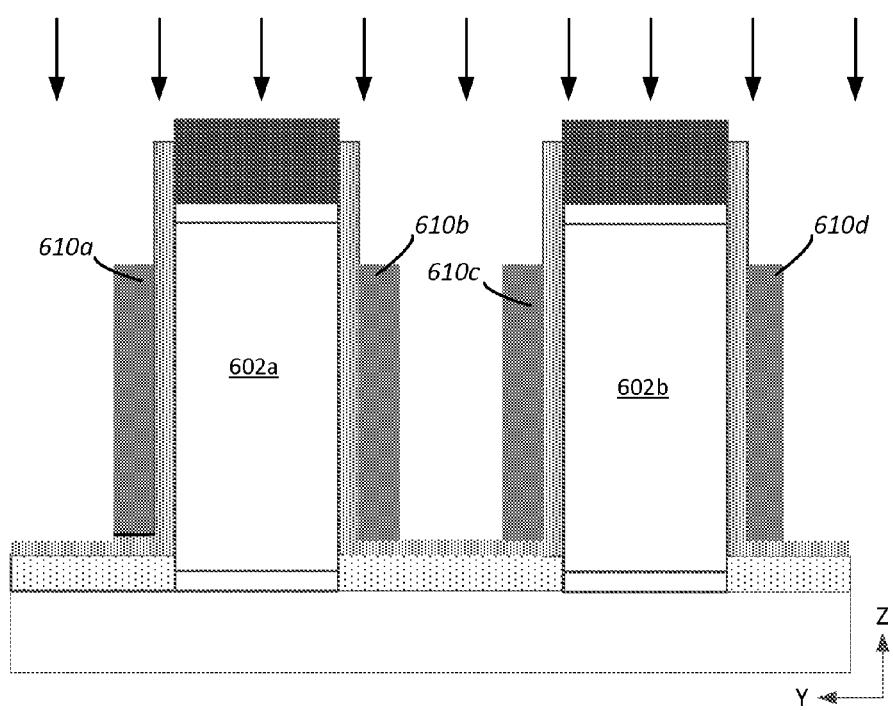
FIG. 17 illustrates removal of filler portions.

In this example, filler material is removed after gate electrodes 610a-d are etched to the right height as shown in FIG. 17. This may be done by ashing or etching. Subsequently, an insulating material may be deposited to fill spaces between gate electrodes and overlie the structure as previously shown in FIG. 15.

Figure 18:
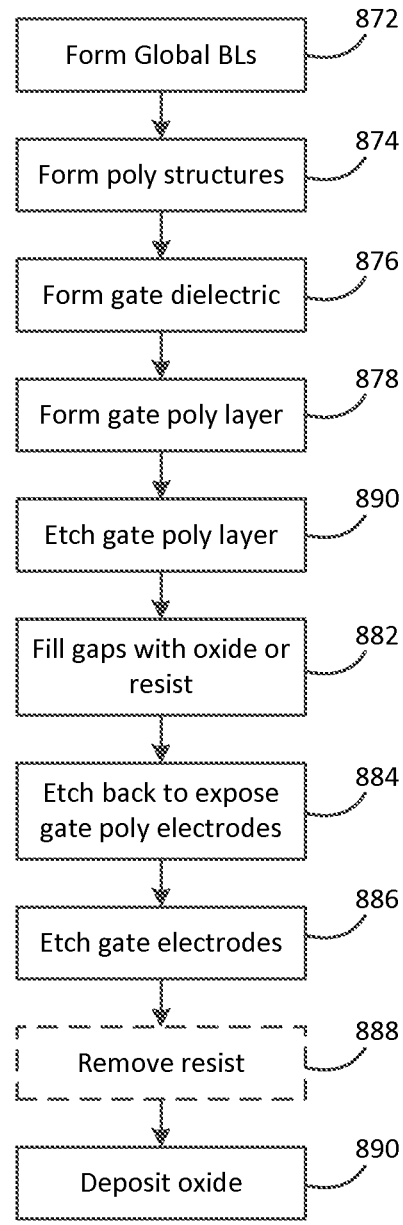
FIG. 18 illustrates a process for forming pillar select transistors.

FIG. 18 illustrates certain steps in a process for making select transistors. Global bit lines (GBLs) are formed 872 extending in the y-direction on a substrate. Subsequently, polysilicon structures are formed 874 on the GBLs. A gate dielectric layer is formed 876 along sides of polysilicon structures and a gate polysilicon layer is formed over that 878. The gate polysilicon layer is then etched 880 to form separate gate electrodes. Subsequently, gaps between gate electrodes are filled 882 with Silicon Dioxide or resist. The filler material is then etched back 884 to expose the tops of the gate electrodes. Subsequently, the gate electrodes are etched to a desired depth 886 while filler portions protect the sides of gate electrodes. If the filler material is resist, or some other material that is not suitable for incorporation in a finished product, it is removed at this point (dashed lines indicate optional step—depending on filler material). Silicon dioxide or some other suitable insulating material is then deposited 890 to insulate gate electrodes.

CONCLUSION

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of forming a three dimensional memory array comprising:
    forming a plurality of vertical polysilicon structures;
    subsequently depositing a dielectric layer on sidewalls of the plurality of vertical polysilicon structures;
    subsequently depositing a polysilicon gate layer on the dielectric layer on sidewalls of the plurality of vertical polysilicon structures;
    subsequently etching back the polysilicon gate layer to form separate polysilicon gate electrodes;
    subsequently forming filler portions between the polysilicon gate electrodes, the filler portions covering sides of the polysilicon gate electrodes and exposing tops of the polysilicon gate electrodes;
    subsequently etching the polysilicon gate electrodes from the exposed tops downwards while the filler portions cover sides of the polysilicon gate electrodes;
    wherein the plurality of vertical polysilicon structures are formed on a plurality of global bit lines that extend horizontally along a first direction; and
    wherein a barrier layer is formed between the plurality of global bit lines and the vertical polysilicon structures.

2. The method of claim 1 wherein the plurality of vertical polysilicon structures form channels of vertical transistors controlled by the polysilicon gate electrodes.

3. The method of claim 1 wherein the polysilicon gate electrodes extend horizontally in a second direction that is perpendicular to the first direction.

4. The method of claim 1 wherein forming filler portions includes etching back a filler material to expose tops of the polysilicon gate electrodes.

5. The method of claim 1 wherein the filler portions are formed of Silicon Dioxide.

6. The method of claim 1 wherein the filler portions are formed of a resist material.

7. The method of claim 1 wherein the polysilicon gate electrodes are etched from the exposed tops downwards using a wet etch.

8. The method of claim 7 wherein the wet etch is selective to the polysilicon gate electrodes over the filler portions.

9. The method of claim 1 further comprising subsequently forming vertical bit lines extending up from the vertical polysilicon structures and controlling current in the vertical bit lines by biasing the polysilicon gate electrodes.

10. A method of forming a vertical transistor comprising:
forming a vertical polysilicon structure;
subsequently depositing a dielectric layer on sidewalls of the vertical polysilicon structure;
subsequently depositing a polysilicon gate layer on the dielectric layer on sidewalls of the vertical polysilicon structure;
subsequently etching back the polysilicon gate layer to form separate polysilicon gate electrodes;
subsequently forming filler portions covering sides of the polysilicon gate electrodes and exposing tops of the polysilicon gate electrodes;
subsequently etching the polysilicon gate electrodes from the exposed tops downwards while the filler portions cover sides of the polysilicon gate electrodes; and
subsequently forming vertical bit lines extending up from the vertical polysilicon structures.

11. The method of claim 10 wherein the vertical polysilicon structure forms a channel of a vertical transistor that is controlled by the polysilicon gate electrodes on either side.

12. The method of claim 10 wherein the vertical polysilicon structure is formed on a global bit line that extends horizontally along a first direction.

13. The method of claim 12 wherein the polysilicon gate electrodes extend horizontally in a second direction that is perpendicular to the first direction.

14. The method of claim 13 wherein a barrier layer is formed between the global bit line and the vertical polysilicon structure.

15. The method of claim 10 wherein forming filler portions includes etching back a filler material to expose tops of the polysilicon gate electrodes.

16. The method of claim 10 wherein the filler portions are formed of Silicon Dioxide.

17. The method of claim 10 wherein the filler portions are formed of a resist material.

18. The method of claim 10 wherein the polysilicon gate electrodes are etched from the exposed tops downwards using a wet etch.

19. The method of claim 10 further comprising subsequently controlling current in the vertical bit lines by biasing the polysilicon gate electrodes.

* * * * *